United States Patent [19]
Law

[11] Patent Number: 5,638,533
[45] Date of Patent: Jun. 10, 1997

[54] METHOD AND APPARATUS FOR PROVIDING DATA TO A PARALLEL PROCESSING ARRAY

[75] Inventor: Patrick Y. Law, Milpitas, Calif.

[73] Assignee: LSI Logic Corporation, Milpitas, Calif.

[21] Appl. No.: 542,191

[22] Filed: Oct. 12, 1995

[51] Int. Cl.[6] ................................................. G11C 7/00
[52] U.S. Cl. ..................... 395/484; 395/436; 395/405; 365/230.03; 365/189.12; 345/196
[58] Field of Search ............................... 395/436, 437, 395/405, 484; 345/196, 197, 201; 365/189.12, 230.03, 230.06, 238.5

[56] References Cited

U.S. PATENT DOCUMENTS

| | | | |
|---|---|---|---|
| 3,670,313 | 6/1972 | Beausoleil et al. | 365/14 |
| 5,257,235 | 10/1993 | Miyamoto | 365/230.03 |
| 5,477,543 | 12/1995 | Purcell | 370/112 |
| 5,487,024 | 1/1996 | Girardeau, Jr. | 364/753 |
| 5,506,978 | 4/1996 | Komori | 395/436 |

*Primary Examiner*—David L. Robertson
*Attorney, Agent, or Firm*—Conley, Rose & Tayon, P.C.; B. Noel Kivlin

[57] ABSTRACT

A data register for providing data values to an n-element parallel processing array includes a memory buffer having first and second memory modules, where each module includes n columns of data values. An address decoder receives an address for accessing n data values at a time from the memory modules and asserts address values to access corresponding rows of the first and second memory modules. Select logic selects between respective columns of the first and second memory modules to retrieve the desired data values according to a predetermined order. A shift network reorders the data values into the correct order, if necessary, and provides the retrieved data values to the processing array. The select logic and shift network preferably include arrays of multiplexers. In particular, the select logic preferably includes an array of n 2:1 multiplexers, and the shift network preferably comprises an array of n×n:1 multiplexers. In an alternative embodiment, the shift network includes multiple stages of arrays of multiplexers. A data register according to the present invention is particularly advantageous for video applications requiring a fast data path, where the data values are 8-bit pixels.

20 Claims, 8 Drawing Sheets

METHOD AND APPARATUS FOR PROVIDING DATA TO A PARALLEL PROCESSING ARRAY

FIELD OF INVENTION

The present invention relates to a data register for providing data to a parallel processing array, and more particularly to an efficient pixel register for providing data to a processor array during video filtering operations.

DESCRIPTION OF THE RELATED ART

Analog technology is quickly giving way to digital technology for storage and transmission of video information. This is primarily due to the increased interest in interactive multimedia and digital TV. Digital video information has many forms including static information, such as for a picture, or dynamic information, such as the case for moving pictures. Digital video information requires an extremely high data rate, so that it is often desirable or even necessary to compress the information for purposes of storage and/or transmission. One type of video compression system is that proposed by the Moving Pictures Expert Group (MPEG), a committee within the International Standards Organization (ISO). The first MPEG video standard, MPEG-1, is fully described in ISO-IEC JTC1/SC2/WG11, MPEG 90/176 Rev. 2, Dec. 18, 1990.

The first phase of the MPEG standard addressed the compression of video signals for digital storage media, like CD-ROM's at about 1.5 mega-bits per second (Mb/s). A second phase, referred to as MPEG-2, concerns high-quality coding of possibly interlaced video, including high definition television (HDTV). A wide range of applications, bit rates, resolutions, signal qualities and services are addressed, including all forms of digital storage media, TV broadcasting and communications. The MPEG system integrates several compression techniques, including motion-compensated predictive coding, discrete cosine transformation (DCT), adaptive quantization and variable-length coding (VLC). Prior to encoding the digital video data, however, it is often filtered or otherwise preprocessed since the data is more easily filtered before the encoding process is performed.

Video information is retrieved using a digital video camera or the like, where the information is sampled and converted to digital format. The data is typically in the form of 8-bit picture elements or "pixels", or simply "pels." Each pixel is preferably scaled to an 8-bit value for red, green and/or blue (RGB) components. The pixel values are then processed by a color matrix circuit or the like, which generates luminance (Y) values, which are weighted sums of the respective RGB components. The Y values are typically used in combination with difference signals or chroma values R-Y ($C_r$) and B-Y ($C_b$) to represent the picture. The pixel values are stored in raster scan format into a memory, such as a random access memory (RAM) or the like. The pixel values may further be processed by a video acquisition unit to extract the active portion of the pictures. The video data stored in the memory is often preprocessed prior to encoding according to MPEG-1, MPEG-2 or any other encoding scheme. Such preprocessing may include filtering functions, such as noise reduction, hierarchical decimation, chroma conversion, deinterlacing functions, etc., where the data is retrieved and stored back into the memory. The present invention concerns the preprocessing or filtering functions performed prior to encoding.

For real time video filtering operations, computational bandwidth on the order (O) of at least 500 million operations per second is required. To perform these functions, a vector processor or vector computer is used since it provides relatively high performance for numerical operations. Such processors often use a SIMD (single-instruction stream multiple-data stream) architecture including a plurality of memory modules coupled to a plurality of parallel processing elements (PPEs). This architecture enables higher bandwidth with parallel access and processing on predetermined subsets of the data, where corresponding streams of data subsets are simultaneously active and processed in parallel.

Figure 3:
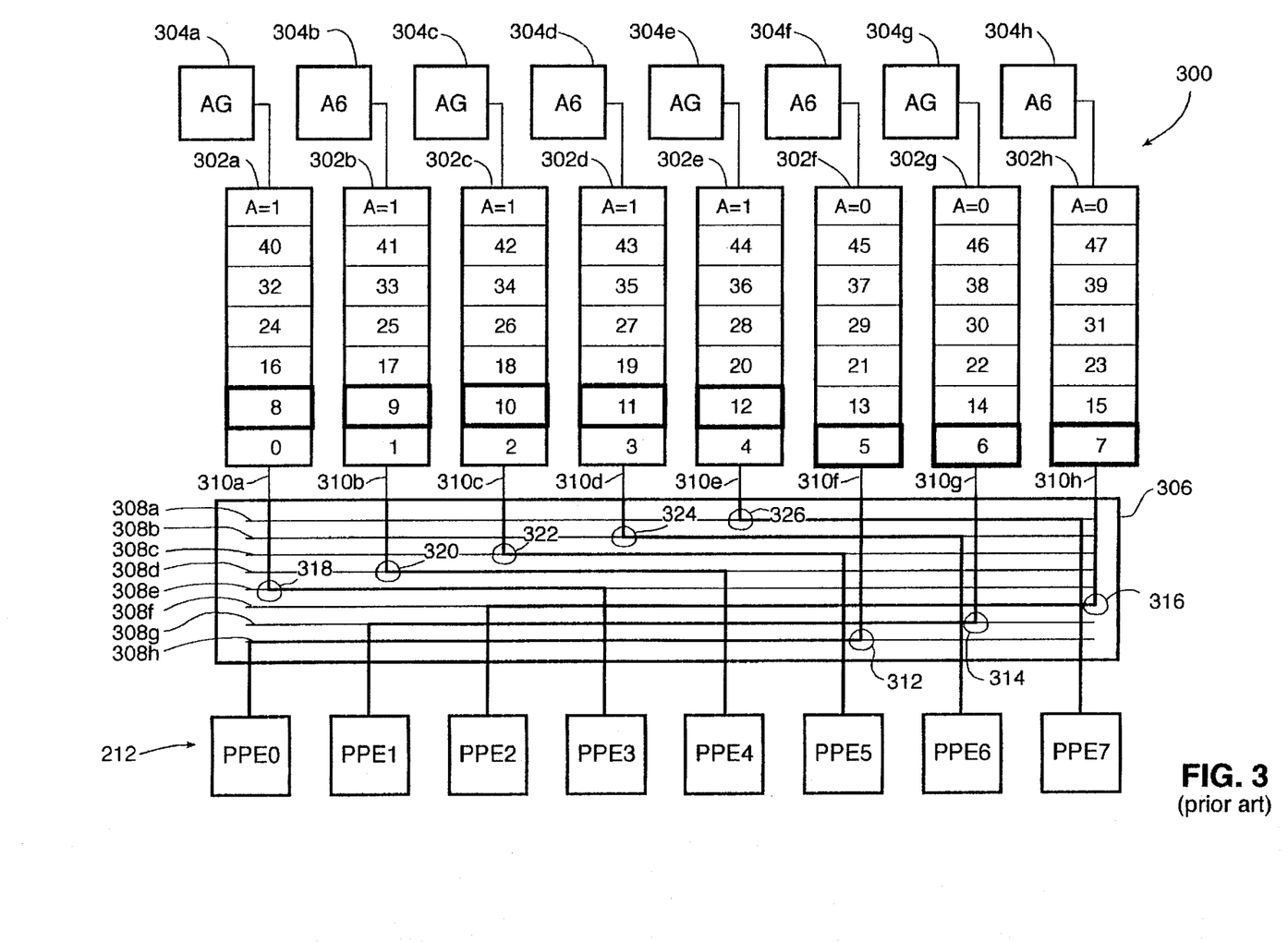
FIG. 3 is a simplified block diagram illustrating a pixel register implementation using a crossbar network according to prior art.

The vector processor typically includes a pixel register for enabling horizontal, vertical, two-dimensional and temporal accesses of the pixel data. FIG. 3 illustrates an exemplary conventional pixel register and processor array for processing eight pixels at a time. The pixel register includes a memory buffer of eight (8) n-bit memory modules coupled to an array of eight (8) parallel processing elements through an 8×8 crossbar network or switch. According to conventional design, the number of memory modules is equal to the number of individual processing elements, where each module supplies a stream of data to an associated processing element. The crossbar network is order $O(n^2)$ for the connection of the processor array and the memory buffer. In particular, the crossbar is proportional to the number of crosspoint switches, which number grows as $n^2$, where n is the number of modules and/or processing elements. Furthermore, each memory module requires a separate address generator for accessing any consecutively stored pixels.

The conventional method is very costly and consumes a large amount of power, where both the cost and power consumption increase with increasing order or size of the crossbar network. Each switch in the crossbar switching matrix includes at least one complementary metal-oxide semiconductor (CMOS) transistor or the like, which further includes a significant amount of capacitance. The constant charging and discharging of the switches during operation consumes an appreciable amount of power. Also, as n increases, the size of the matrix grows prohibitively large consuming valuable space, which tends to increase the cost of implementation. Furthermore, each memory module requires a significant amount of overhead, such as a plurality of separate address generators, power grids for the RAM, substantial amount of routing conductors, etc.

It is desired to achieve the performance of a vector processor without the prohibitive cost and power consumption of the standard crossbar network.

SUMMARY OF THE INVENTION

A data register according to the present invention for providing data values to an n-element parallel processing array comprises a memory buffer including first and second memory modules, where each module includes n columns of data values. An address decoder receives an address for accessing n data values at a time from the memory modules and asserts address values to access corresponding rows of the first and second memory modules. Select logic selects between respective columns of the first and second memory modules to retrieve the desired data values according to a predetermined order. A shift network reorders the data values into the correct order, if necessary, and provides the retrieved data values to the processing array. A data register according to the present invention is particularly advantageous for video applications requiring a fast data path, where the data values are 8-bit pixels.

In the preferred embodiment, the select logic comprises an array of n multiplexers (muxes), each for selecting between corresponding columns for the first and second memory modules. Each memory module is preferably 8 pixels wide, where each pixel is 8 bits, for a total of 64 bits. The array of muxes are preferably 2:1, 8-bit muxes, although any convenient size may be used depending upon the specific application. Several implementations are possible for the shift network. In the preferred embodiment, the shift network is a right shift network comprising a plurality of muxes. In one embodiment, a plurality of stages of 2:1 muxes enable shifting of one, two and four shifts, respectively, to enable a right shift from anywhere between 0 and 7 shifts. In an alternative embodiment, the shift network comprises a shift network including 8×8:1 muxes, each receiving a three-bit address indicating the number of shifts desired. In this manner, the pixels are retrieved from the memory banks and reordered in a relatively efficient manner without consuming a considerable amount of power. Furthermore, the order of the network is of $O(n\log_2 n)$, where n is typically 8, as compared to $O(n^2)$, which is the case for a crossbar network. In this manner, the present invention consumes less space and power and is considerably less costly than a comparable crossbar network typically used for a parallel processing array.

Furthermore, only two memory banks need be used, rather than n memory banks typically used for a crossbar network. A plurality of memory modules typically requires an address generator for each module, thus representing a significant amount of overhead. In a pixel register according to the present invention, only two memory modules are needed, and a single address generator provides the necessary address values, select codes to the select logic and shift codes to the shift logic. The address value provided to select rows of the second module is a conditional increment of the address value provided to the first module, thereby simplifying the logic of the address generator. This substantially simplifies the hardware and considerably reduces the amount of overhead associated with the memory modules.

A pixel register according to the present invention is preferably used within a programmable filter for performing filtering functions, such as noise reduction, hierarchical decimation, chroma conversion, deinterlacing functions, etc. where the data is retrieved and stored back into a memory for access by a decoder system. The filter is preferably implemented as a vector processor using a single instruction stream multiple data stream (SIMD) architecture for providing a plurality of pixels to corresponding parallel processing elements (PPEs). The filter includes a coprocessor register file, a microcontroller, read and write address generators, a coefficient register, a pixel array implemented according to the present invention and a plurality of PPEs coupled to the pixel register. Data is generally transferred across a video bus using a memory controller or the like. Pixel data is stored in the pixel register and addressed by a read address generator for processing by the parallel processor array.

A method for providing data to an n-element processing array according to the present invention includes the steps of storing data values into two memory banks, each bank including n columns and a plurality of rows of data values, decoding an address for determining the rows in each memory bank holding the data values indicated by the address, selecting between respective columns of the memory banks to select the addressed data values into a predetermined order, and reordering the selected data values to the correct order indicated by the address and providing the reordered data values to the n-element processing array. The storing step preferably involves distributing consecutive data values into consecutive locations of the rows of the first and second data banks. The decoding step preferably involves determining an address value to each of the first and second memory banks to access rows containing the data values indicated by the address, determining a select value identifying the columns containing the data values indicated by the address, and determining a shift value indicative of a number of shifts to reorder the data values.

In this manner, a method and apparatus for providing data to a processor array according to the present invention provides all the benefits and advantages of a crossbar network without its inherent cost, size and power consumption.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
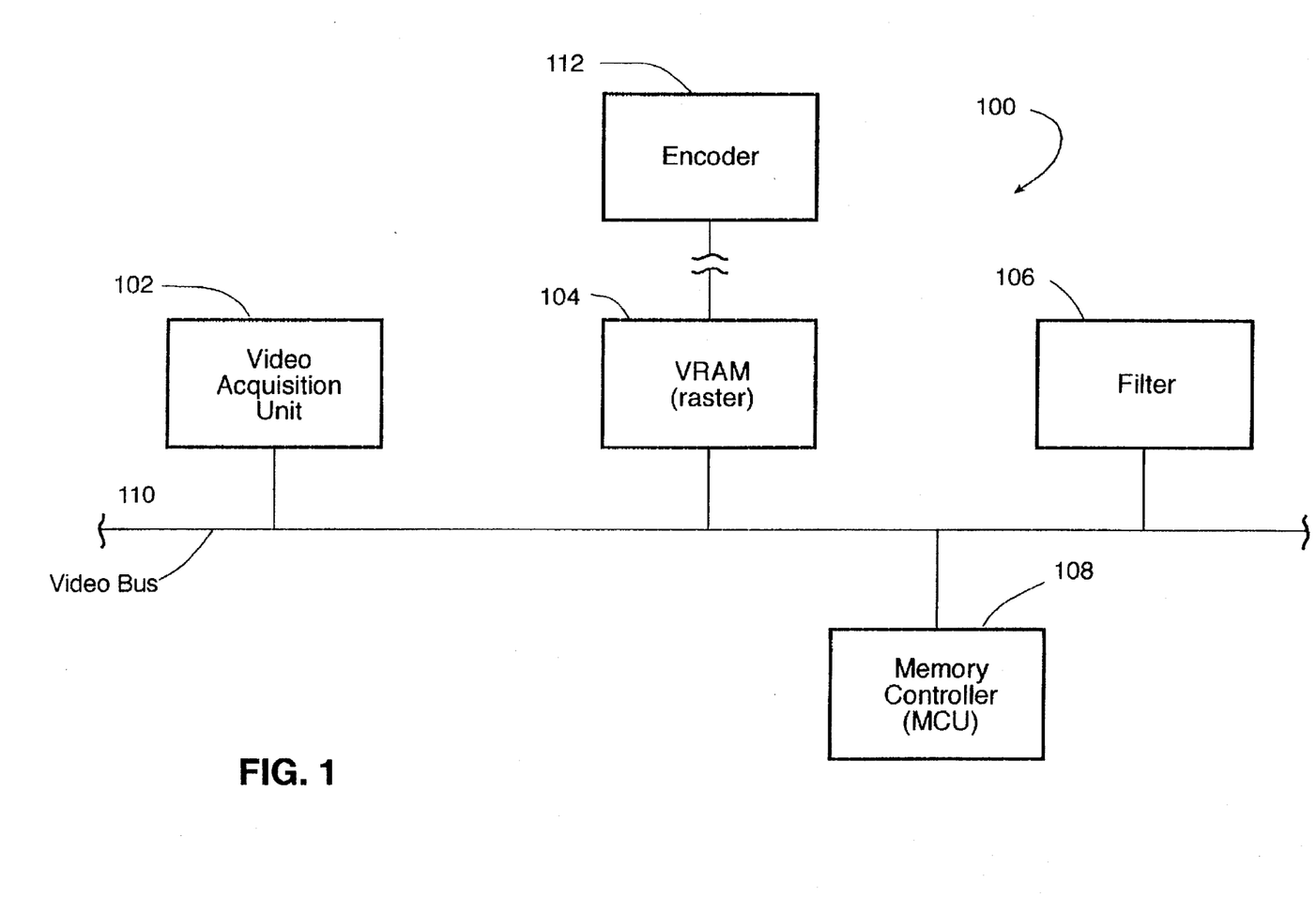
FIG. 1 is a block diagram illustrating a video system according to the present invention.

Referring now to FIG. 1, a simplified block diagram illustrates a video system 100 according to the present invention. Video data is detected and sampled using a digital video camera (not illustrated) or the like for providing digital values. The digital values may have one of many forms, but are usually represented in the form of red, green and blue (RGB) pixel values scaled to 8 bits representing values between 0 and 255. The pixel values are usually converted into luminance values (Y), which are a weighted sum of the respective RGB values, and into corresponding chrominance values R-Y or $C_r$ and B-Y or $C_b$. This conversion is performed using a conventional color matrix or the like, where the data remains scaled to 8-bit pixel values. The pixel values are then provided to a video acquisition unit 102 for extracting the active portion of the picture or pictures.

It is noted that the present invention is not limited to any particular format of pixel data. Further, the present invention may be used with any type of digital data and not necessarily pixels or video data. The present invention may be applied in any type of vector processing application where an array of parallel processors process vector type digital data in parallel.

The video acquisition unit 102 is preferably coupled to a video bus 110 for transferring the pixel values to a video random access memory (VRAM) 104, where the pixel values are preferably stored in raster scan format. A programmable filter 106 is also coupled to the video bus 110 for preprocessing the pixel values stored in the VRAM 104 prior to encoding by an encoder 112. The programmable filter 106 retrieves the data from the VRAM 104 and performs any one of several programmable functions according to the particular application for the video system 100. For example, preprocessing filtering operations may include noise reduction, hierarchical decimation, chroma 4:2:2 to 4:2:0 conversion, deinterlacing, pull-down detection for detecting repetitive fields, etc. The processed pixel values are preferably stored back into the VRAM 104 after being processed. Data transfer between the video acquisition unit 102, the VRAM 104 and the filter 106 is preferably controlled by a memory controller (MCU) 108 which is also coupled to the video bus 110. The VRAM 104 is preferably dual port memory including another port for transferring processed pixel values to the encoder 112 for purposes of encoding the data for storage and/or transmission. The encoding process is preferably according to the MPEG-1 or the MPEG-2 standards, although the MPEG standards are for example only since any particular encoding scheme is contemplated.

Figure 2:
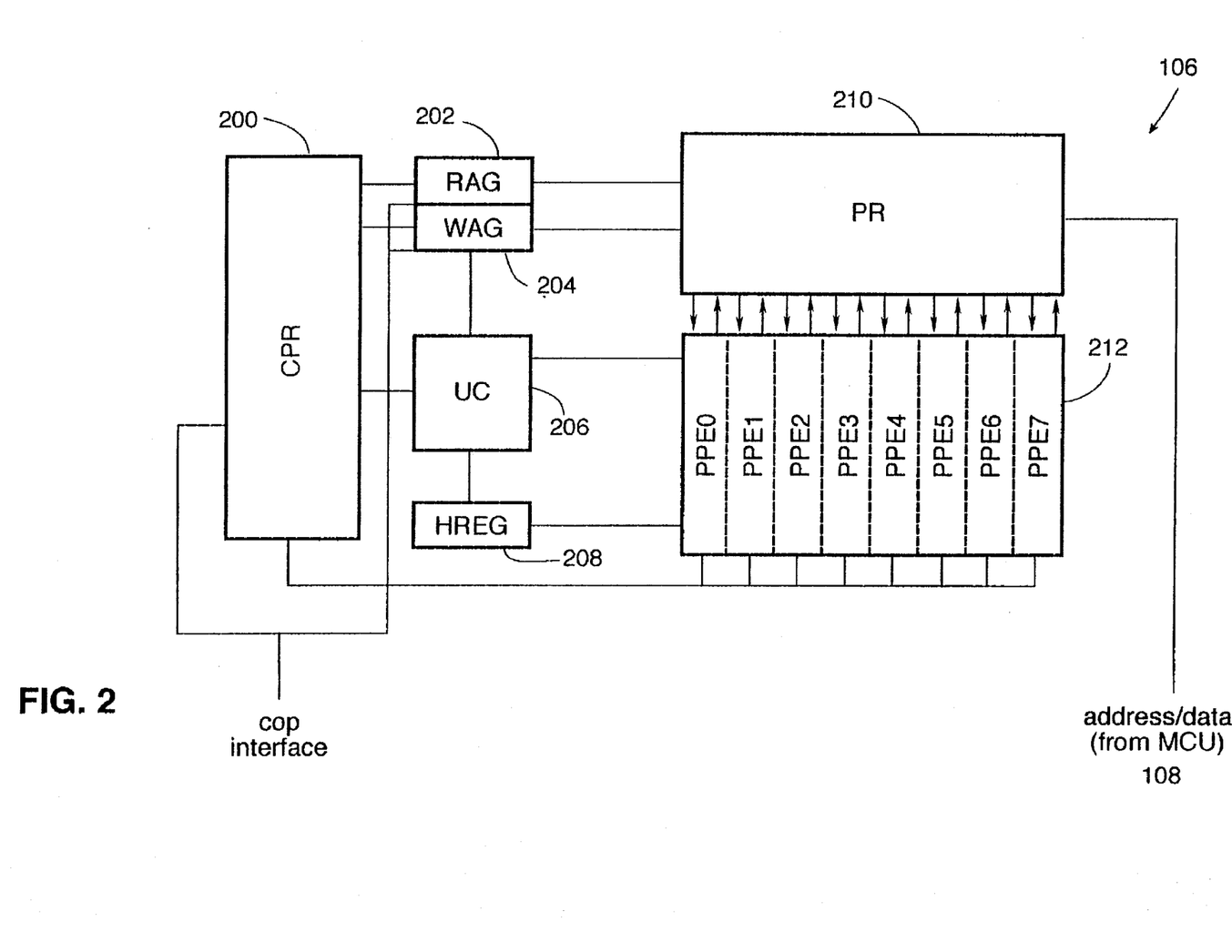
FIG. 2 is a block diagram of the programmable filter of FIG. 1.

Referring now to FIG. 2, a more detailed block diagram is illustrated of the programmable filter 106. The programmable filter 106 includes a coprocessor register file (CPR) 200, which is the primary interface to a host CPU (not shown). The CPR 200 is further connected to a read address generator (RAG) 202, a write address generator (WAG) 204 and a microcontroller (UC) 206. The microcontroller 206 is further connected to a coefficient register file (HREG) 208 for storing coefficient values used in video filtering operations. The RAG 202 and WAG 204 are also connected to a pixel register (PR) 210, which receives addresses and data from the MCU 108. The pixel register 210 is further coupled to an array of parallel processing elements (PPE) 212, preferably including eight elements PPE0–PPE7. In the preferred embodiment, pixels are processed eight at a time although the filter 106 may be generalized to process any number of pixels at a time depending upon the particular application. Eight pixels is relevant to the memory bus structure implemented in the design which fetches/stores pixels in groups of eight at a time.

The RAG 202 generates read addresses to the pixel register 210 for loading data into the processor array 212 while the WAG 204 generates write addresses to the pixel register 210 for storing results from the processor array 212. Each of the address generators, RAG 202 and WAG 204, are programmable to produce addresses for reading or writing multiple blocks of pixels. The microcontroller 206 retrieves instructions through the coprocessor interface from the host CPU. The microcontroller 206 then steps through a dispatch routine preferably stored in a micro-instruction memory within the microcontroller 206. Control signals are then generated by the microcontroller 206 for controlling the operation of the programmable filter 106. As described more fully below, the programmable filter 106 utilizes a single-instruction stream, multi-data stream (SIMD) data path, where a single instruction received by the microcontroller 206 is used to process data within the pixel register 210 using the processor array 212. The HREG 208 preferably includes sixteen 10-bit broadcasting coefficients provided to the processor array 212.

The processing elements PPE0–PPE7 of the processor array 212 preferably operate in a lock-step manner with each other in response to instructions received and executed by the microcontroller 206. Each processing element receives its own input data stream from the pixel register 210. After the required computation is performed by the respective processing elements PPE0–PPE7, the results are written back into the pixel register 210. In the preferred embodiment, each one of the processing elements PPE0–PPE7 consists of a multiplier, an arithmetic logic unit (ALU), a shifter, a register file, round and clip circuitry and some control logic. Pipeline stages are preferably inserted into the data path in order to fit a particular critical cycle time.

The pixel register 210 is a vector memory which is used for storing and retrieving a pixel array. It preferably functions as a buffer between the fast SIMD data path and the external VRAM 104, which is relatively slow. The pixel register 210 generally includes a memory for storing pixel values and a connection network for providing the pixel values to, and for retrieving the processed pixel values from, the processor array 212. For real time video filtering operations, computational speed of at least 500 million operations per second is required to achieve the desired bandwidth. Thus, the interface between the pixel register 210 and the processor array 212 must operate in an extremely fast manner.

FIG. 3 is a simplified block diagram of a pixel register 300 implemented according to prior art as connected to the processing elements PPE0–PPE7. A memory buffer 302 includes a plurality of n-bit memory modules, one for each of the processing elements PPE0–PPE7. In this particular example, each pixel value is 8 bits, and there is one memory module 302a, 302b, 302c, 302d, 302e, 302f, 302g and 302h for each of the eight processing elements. Each memory module 302a–h is controlled by a separate address generator (AG) 304a–h, respectively, for accessing individual pixels within each of the modules. The address generators 304a–h determine which pixel within each of the address modules 302a–h are accessed at any given time. In the example shown in FIG. 3, the lowermost element is at address 0, the next element above is at address 1, etc. Highlighted pixel values 5, 6 and 7 are at address 0 within the modules 302f–h, respectively, and highlighted pixel values 8, 9, 10, 11 and 12 are at address 1 within the modules 304a–3, respectively.

To enable connection for each of the address modules 302a–h to each of the PPEs 0–7, respectively, a crossbar network 306 is illustrated. The crossbar network 306 has a corresponding size of "n" equaling the number of memory modules and "m" equaling the number of processing elements, where in the embodiment illustrated, n=m=8 for an order of $O(n^2)=64$ network. Each of the processing elements PPE0–PPE7 are connected to a corresponding bus signal 308a–h, respectively, within the crossbar network 306, and each of the memory modules 302a–h includes a corresponding bus signal 310a–h, respectively, for potential connection to any one of the bus signals 308a–h. 64 switches are provided within the crossbar network 306 for potentially coupling each of the bus signals 308a–h to corresponding ones of the bus signals 310a–h, so that each of the memory modules 302a–h is connected to a corresponding one of the processing elements PPE0–PPE7. In particular, each memory module 302a–h and its associated bus signal 310a–h are associated with eight switches for coupling to any one of the bus signals 308a–h at a time. Thus, only one of the eight switches associated with each memory module 302a–h is activated at a time for connecting that memory module to a corresponding one of the processing elements PPE0–PPE7 through the crossbar network 306.

In the example illustrated in FIG. 3, eight pixels numbered 5–12, are to be accessed and provided to the processing elements PPE0–PPE7, respectively. In particular, pixel 5 is provided to the PPE0, pixel 6 is provided to PPE1, pixel 7 is provided to PPE2, pixel 8 is provided to PPE3, etc. In operation, the address generators 304f–h assert an address of "0" for accessing the pixel elements 5, 6 and 7, respectively, and switches 312, 314 and 316 are activated to connect the memory modules 302f–h to the processing elements PPE0–PPE2, respectively. Simultaneously, the address generators 304a–e each assert an address of "1" for accessing the pixel values 8–12, respectively, and switches 318, 320, 322, 324 and 326 are activated within the crossbar network 306 to connect the memory modules 302a–e to the processing elements PPE3–PPE7, respectively. In this manner, any group of eight pixels, one each from the memory modules 302a–h, are provided to the processing elements PPE3–PPE7 in any order using the crossbar network 306.

Although the pixel register 300 illustrated in FIG. 3 is relatively powerful and flexible because of the crossbar network 306, it is also very costly and consumes a considerable amount of power. Each memory module 302a–h provides an independent stream of pixel data to a corresponding one of the parallel processing elements 212, but requires a significant amount of overhead, such as its own address generator 304a–h, a power grid for the RAM and routing, etc. The crossbar network 306 includes a plurality of switches, such as bipolar or CMOS transistors or the like, which include an appreciable amount of capacitance which consume a considerable amount of power during operation to continuously charge and discharge the capacitors. The size of the crossbar network 306 is of the order $O(n^2)$ which is indicative of the size, power consumption and cost of the crossbar network 306, and is therefore very expensive to implement and consumes a considerable amount of power during operation.

Figure 4:
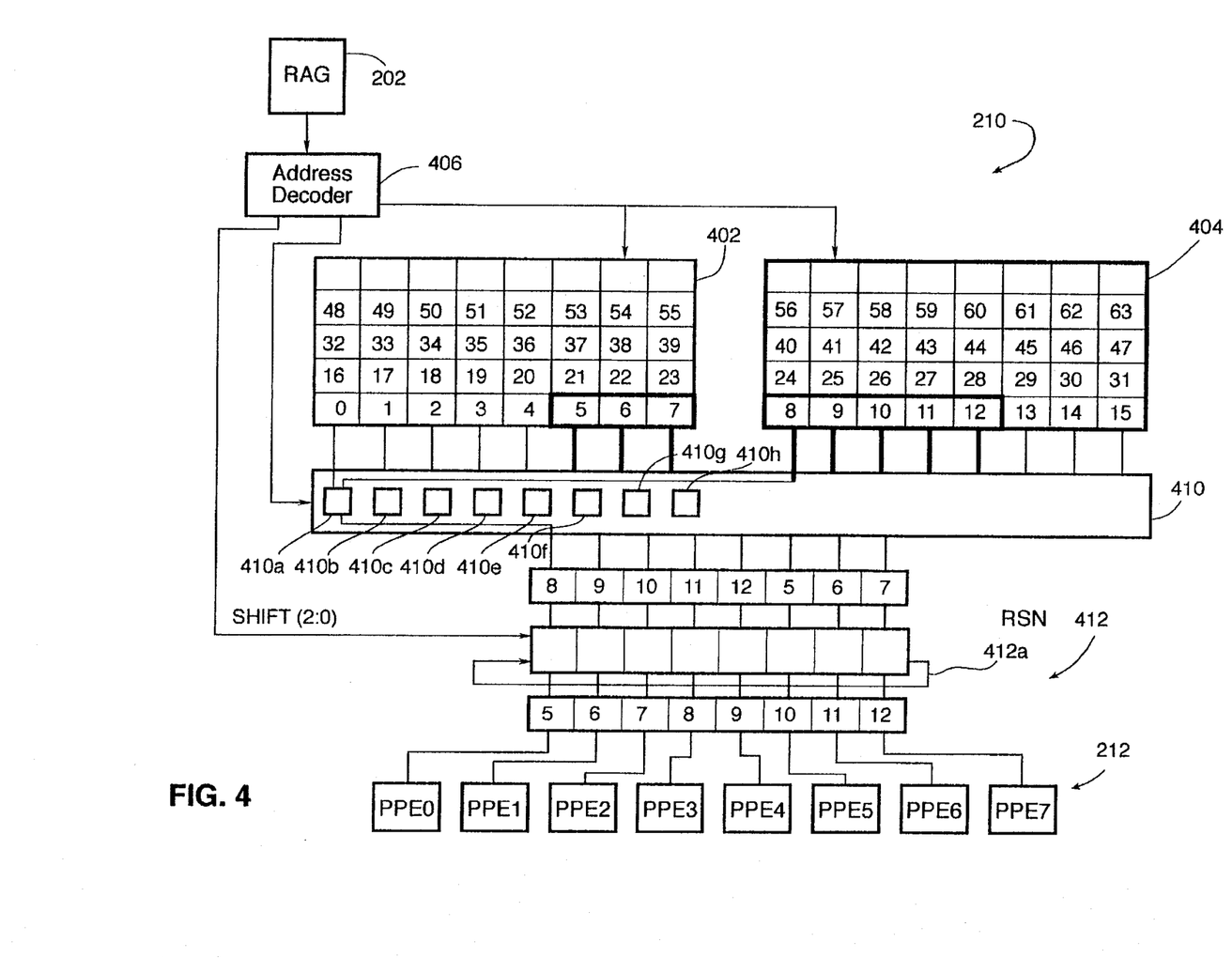
FIG. 4 is a simplified block diagram of the pixel register of FIG. 2 implemented according to the present invention.

Referring now to FIG. 4, a simplified block diagram is illustrated of the pixel register 210 of FIG. 2 implemented according to the present invention and coupled to the processing elements PPE0–PPE7 of the processor array 212. The primary memory buffer preferably includes two eight by j-bit wide memory modules 402, 404 for storing the pixel values. As compared to the configuration of FIG. 3, each memory module 402, 404 has the same width or number of columns as the combined width of the modules 302a–h, so that the modules 402, 404 together double the effective width and number of columns. Each row of the memory buffer includes a corresponding row of each of the modules 402, 404. Thus, for n=8, the first row of the memory buffer stores the first 16 consecutive pixel values, eight in each row of the modules 402, 404, and the next 16 pixel values are stored in the next row of the memory buffer, and so on.

Preferably, each pixel value is 8 bits (j=8) so that the memory modules 402, 404 are each 64 bits wide. Pixel values are indicated by indexes, where pixel values associated with indexes of 0–7 are stored in the even memory module 402, and those associated with indexes 8–15 are stored in the odd memory module 404. Likewise, the pixel values indexed as 16–23 are stored in the even memory module 402 above the pixel values indexed by 0–7, respectively, whereas the pixel values indexed by 24–31 are stored in the odd memory module 404 above the pixel values indexed by 8–15, respectively, and so on.

The pixel values in the memory modules 402, 404 are accessed by two address values, respectively, asserted by an address decoder 406. The address decoder 406 receives an address from the RAG 202, and provides the corresponding address values to the memory modules 402, 404. It is noted that two separate address decoders might normally be required to assert two address values to the modules 402, 404. However, the present invention allows a simpler implementation where the second address value provided to the odd memory module 404 is simply a conditional increment of the first address value provided to the even module 402. In particular, a value of 1 is added to the first address if the first of the eight addressed pixels lies in the odd memory module 404. Otherwise, the address values to both memory modules 402, 404 are the same. In this manner, separate address generators are not needed and a relatively simple address decoder 406 is sufficient.

The memory modules 402 and 404 are coupled to an 8×2:1 multiplexer (mux) array 410, which preferably includes eight 2:1 8-bit muxes 410a–h. Each of the muxes 410a–h of the array 410 includes two data inputs, where each input is coupled to respective columns of the even and odd memory modules 402 and 404. In particular, the mux 410a has one input for receiving a pixel value from the column at index 0 of the even memory module 402, which is the first column of the module 402. The other input of the mux 410a receives a pixel value from the column at index 8 of the odd memory module 404, which is the first column of the module 404. Thus, the mux 410a selects between the first columns of the modules 402, 404. In a similar manner, the muxes 410b–h each have their respective inputs connected to receive pixel values at indexes 1 and 9, 2 and 10, 3 and 11, etc. for the 2nd, 3rd, 4th, etc. columns of the even and odd modules 402 and 404, respectively, for selecting between respective columns of the memory modules 402, 404.

The address decoder 406 asserts an 8-bit select code to the mux array 410, one bit for each of the muxes 410a–h. A select bit equal to zero selects the even memory module 402 while a select bit equal to one selects the odd memory module 404. In the example of FIG. 4, pixel values at indexes 5–12 are highlighted to be selected. The muxes 410a–e receive select bits equal to one to select the pixels 8–12 and the muxes 410f–h receive select bits equal to zero to select the pixels 5–7, respectively. It is noted that due to this configuration, the pixels are selected by the mux array 410 in a predetermined order depending upon the particular pixels selected. This ordering, however, is not necessarily the order intended by the address asserted by the RAG 202.

The eight-bit outputs of the muxes 410a–h are provided to the inputs of respective locations of a right shift network (RSN) 412, where the outputs of such corresponding locations are further connected to the processing elements PPE0–PPE7. In this manner, the address decoder 406 asserts address values to select the desired rows of the even and odd memory modules 402 and 404 containing the pixel values. The address decoder 406 also asserts the select code to the muxes 410a–h for selecting a desired column of either the even memory module 402 or the odd memory module 404 for determining specific pixel values to be loaded into the RSN 412. As in the example of FIG. 3, the highlighted pixel values 5–12 are addressed and loaded into the RSN 412, although not initially in the desired order for the processing elements PPE0–PPE7. Thus, the leftmost mux 410a selects pixel value 8 into the leftmost location of the RSN 412, so that the order in the RSN 412 is initially 8, 9, 10, 11, 12, 5, 6 and 7. The RSN 412 is provided to reorder the pixels into the intended order indicated by the address asserted by the RAG 202.

The RSN 412 is illustrated including a feedback path 412a for connecting the least significant bit (LSB) to the most significant bit (MSB) to enable right shifting of the pixel values stored in the RSN 412. The address decoder 406 asserts a shift value to the RSN 412 indicating the desired number of pixel shifts. In the preferred embodiment, the shift value need only be 3 bits for selecting 0–7 pixel shifts for the eight pixel values. In the example illustrated, a shift value of 011 or 3 is provided to reorder the pixels as desired. In particular, the pixel values 7, 6 and 5 are shifted out from the LSB side over to the MSB side of the RSN 412, one at a time. Since the pixel values are each eight-bit values, 24 bits are right shifted in the RSN 412 to rearrange the pixel values to the correct order 5–12. After this shifting is performed, the pixel values 5–12 are provided in the correct order to the processing elements PPE0–PPE7, respectively.

There are several benefits with the pixel register 210 illustrated in FIG. 4 as implemented according to the present invention. First, only two memory modules 402 and 404 are provided, rather than the eight separate modules required in FIG. 3. The associated overhead is simplified since the second address to the odd memory module 404 is simply a conditional increment of the first address, so that only one address decoder need be provided. Once the correct pixels are loaded into the RSN 412, they are simply right-shifted the appropriate number of times to place them in the correct order for loading into the processor array 212. Very simple logic is needed within the decoder logic 406 for determining the correct pixels and the desired number of shifts required. The order of the pixel register 210, indicative of its complexity, is only $O(n\log_2 n)$, where n=8 in the particular example of FIG. 4.

For vertical and temporal accesses, both designs read the buffers in eight by j-bit boundaries. To access data two-dimensionally, the access pattern is broken down into a horizontal direction and then into a vertical direction. In this manner, the pixel register 210 illustrated in FIG. 4 performs all the functions of the pixel register 300 illustrated in FIG. 3.

The RSN 412 including the feedback path 442a is illustrated for purposes of illustration but would not provide the fastest operation. Actually right shifting bits through the RSN 412 in this manner is relatively slow and such an implementation takes may take too much time depending upon the desired data throughput. The RSN 412, therefore, may be implemented in more efficient ways, such as using multistage muxes or even a single stage 8 by 8:1 muxes to achieve the desired rearrangement of the pixels. The particular implementation is a matter of design choice based on cost and speed considerations. A couple of exemplary implementations will now be described, although other particular implementations are possible. It is also noted that a left shift network could equally be used, as well as any type of re-ordering network known to those skilled in the art.

Figure 5A:
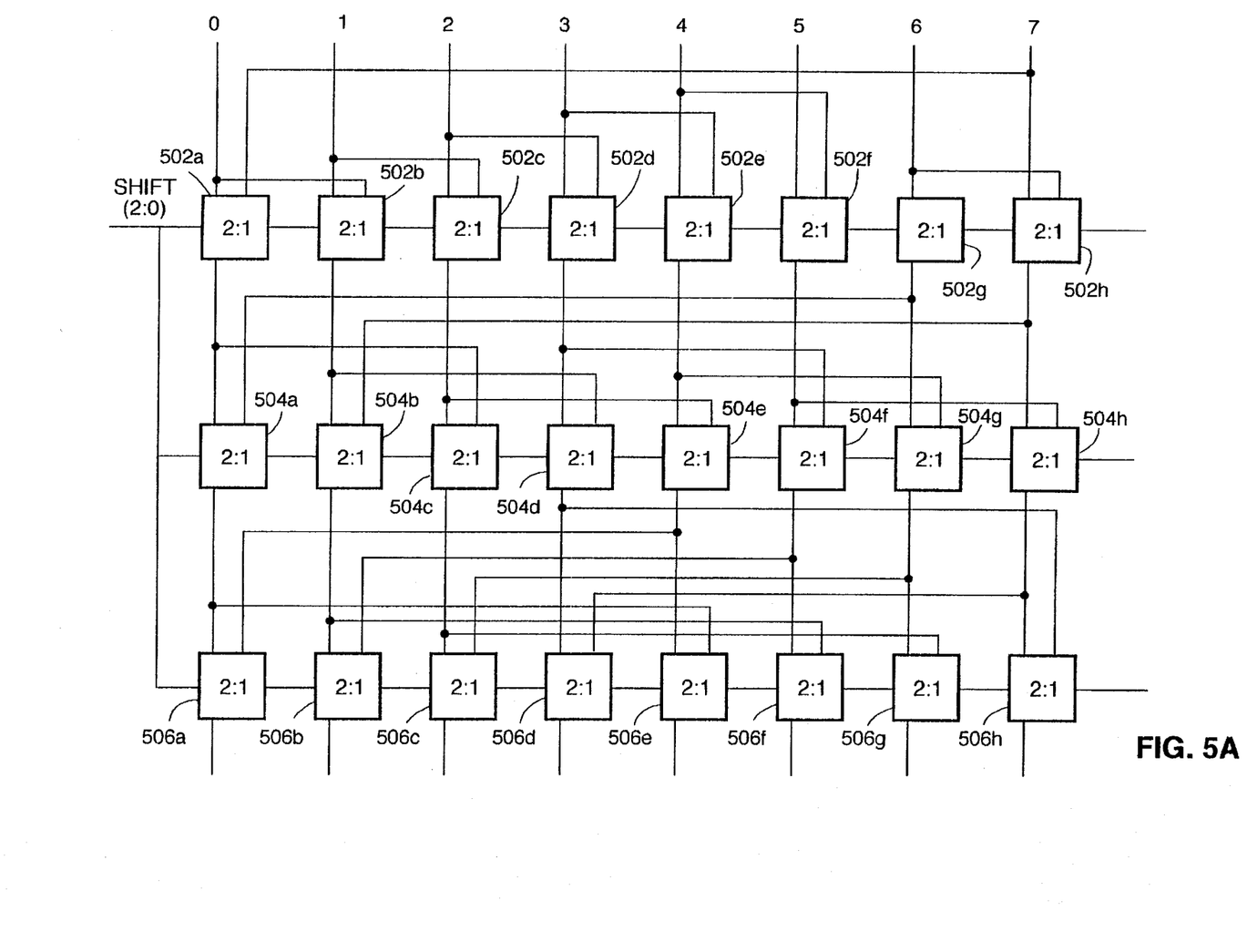
FIGS. 5A and 5B are schematic diagrams of exemplary and alternative implementations of the right shift network of FIG. 4.

Referring now to FIG. 5A, a more detailed diagram is illustrated of one implementation of the RSN 412 of FIG. 4 using three stages (or rows) of muxes. A first stage of 8×2:1, 8-bit muxes 502a–h each have one data input coupled to the corresponding output of the muxes 410a–h, respectively, and its other data input receiving the output of an adjacent mux of the muxes 410a–h. In particular, the mux 502a receives the output of the mux 410h, and the other data input of the muxes 502b–h receives the output of the muxes 410a–g, respectively. A select bit of zero provided to all of the muxes 502a–h would allow pass through without any shifting, whereas a select bit of one would enable a right shift of one pixel.

Another stage of 8×2:1, 8-bit muxes 504a–h are provided, each having one data input connected to the outputs of the muxes 502a–h, respectively, and its other data input coupled to the next adjacent mux to perform a double shift. In particular, the other inputs of the muxes 504a,b receive the outputs of muxes 502j,h, respectively, and the other data inputs of each of the muxes 504c–h receive the outputs of muxes 502a–f, respectively. A select bit of zero provided to the select input of all the muxes 504a–h allows pass through without shifting pixels, whereas a select bit of one enables a shift of two pixels.

A third stage of 8×2:1, 8-bit muxes 506a–h are provided to perform a quadruple shift. In particular, the muxes 506a–d each have one data input connected to the respective outputs of the muxes 504a–d, and the other data input connected to the respective outputs of the muxes 504e–h. The muxes 506e–h each have one data input connected to the respective outputs of the muxes 504e–h, and the other data input connected to the respective outputs of the muxes 504a–d. Again, a select bit of zero provided to all of the muxes 506a–h allows pass through with no shift whereas a select bit of one enables a shift of four pixels. The three stages together form a 3×8×2:1 mux network having an order of $O(n\log_2 n)$.

The RSN 412 receives a 3-bit binary shift value from the address decoder 406 indicating the number of right shifts desired. In particular, one bit of the right shift address value is provided to the select inputs of the muxes 502a–h, another bit is provided to the select inputs of the muxes 504a–h and the last bit is provided to the select inputs of the muxes 506a–h. For example, a shift value of 001 (binary 1) indicates a shift of one pixel value, where the muxes 502a–h receive the LSB bit of one to shift the pixels right by one pixel value, whereas the muxes 504a–h and 506a–h receive select bits zero and simply pass the pixel values without any shift. Likewise, a shift value of 101 (binary 5) causes the muxes 502a–h to shift by 1, the muxes 504a–h to pass values with no shift and the muxes 506a–h to shift four pixel values to the right, for a total of 5 pixel shifts to the right.

The three-stage mux RSN illustrated in FIG. 5A is significantly faster than a bit-by-bit implementation, although it is slightly more complex. Nonetheless, the use of the 3-stage RSN combined with the single stage mux array 410 is much less costly and less power consuming than the crossbar network 306 of FIG. 3.

Figure 5B:
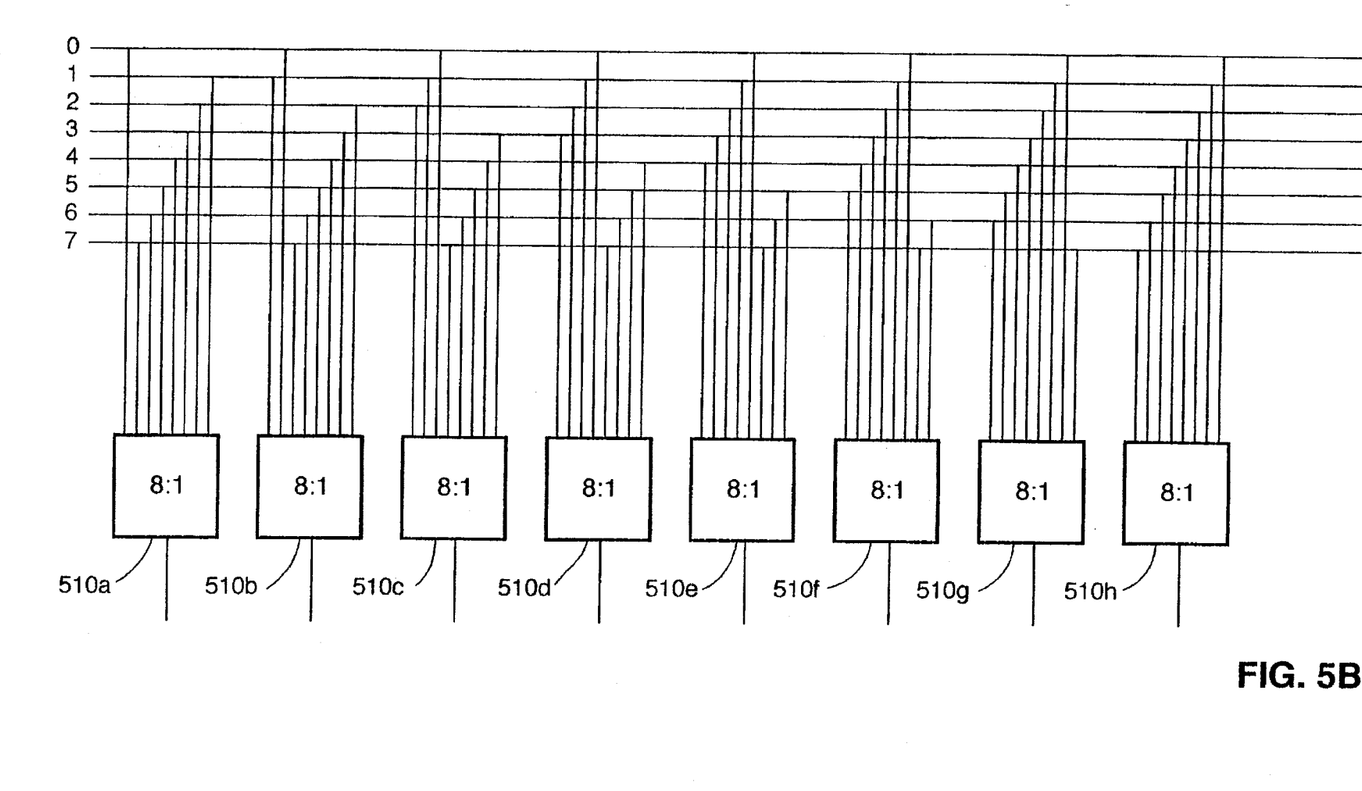

FIG. 5B illustrates an alternative embodiment of the RSN 412 including 8×8:1, 8-bit muxes 510a–h. Each of the muxes 510a–h receive the 3-bit right shift address to perform the desired number of pixel value right shifts. In particular, the bit-zero data input of each of the muxes 510a–h receive the outputs of the muxes 410a–h, respectively, in the event no right shift is desired. The bit-one data input of each of the muxes 510a–h receive the outputs of the muxes 410h, 410a–g, respectively, for a single right shift and so on. The use of the 8×8:1 muxes 510a–h is slightly more expensive than the three-stage embodiment of FIG. 5A. However, the embodiment illustrated in FIG. 5B using the muxes 510a–h is faster than the three-stage embodiment since only a single stage of delay is encountered. Although the routing required for the 8×8:1 mux network is slightly more complicated than for the 3×8×2:1 mux network of FIG. 5A, the order is still considerably less than that required for the crossbar network of prior art, not to mention the other overhead savings and advantages. For example, an 8:1 mux can be implemented using 7 2:1 muxes.

Figure 6:
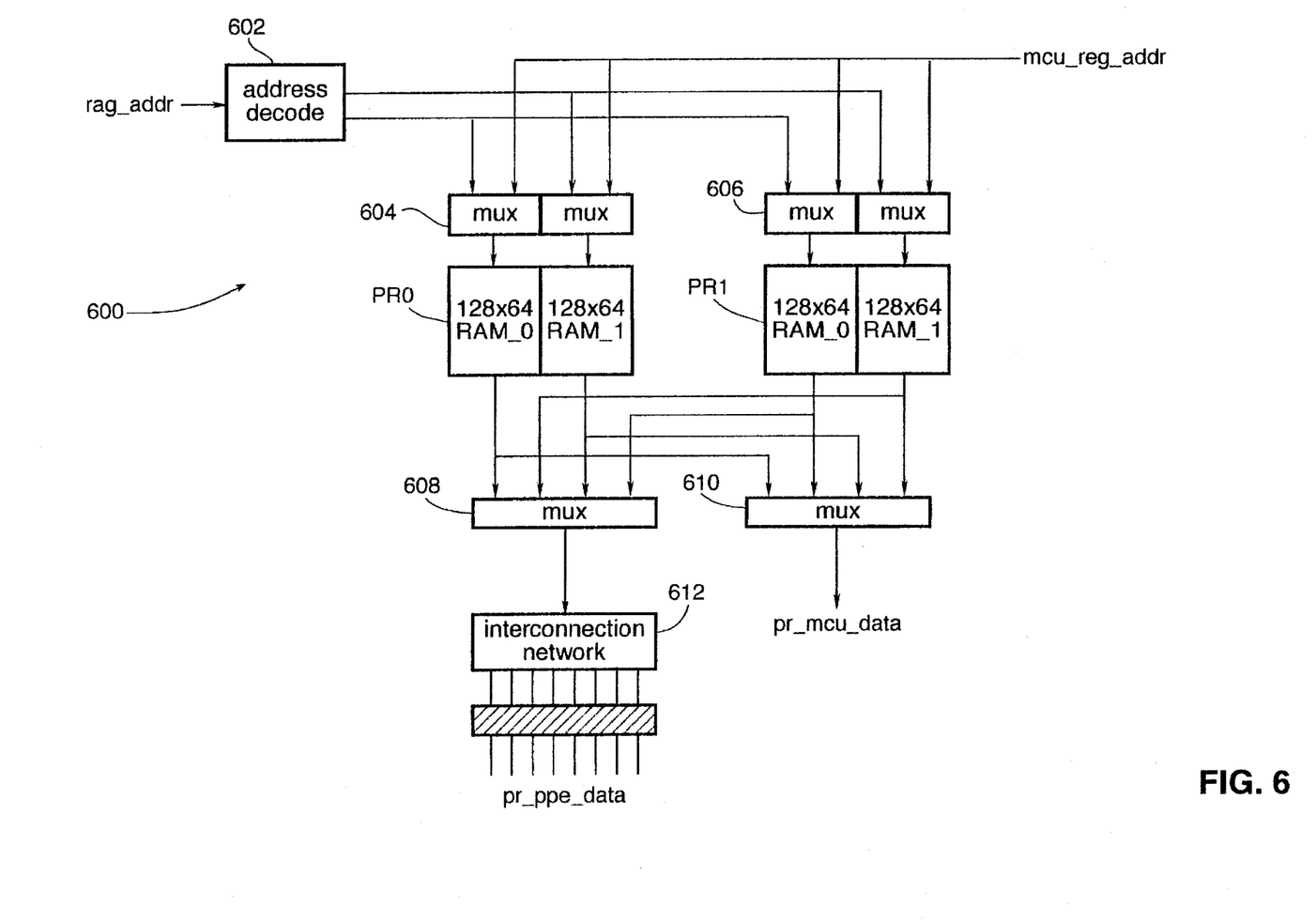
FIG. 6 is a more detailed block diagram of the read path circuitry of the pixel register of FIG. 2.

Referring now to FIG. 6, a more detailed block diagram is illustrated of one embodiment the pixel register 210 illustrating the read data path. In the preferred embodiment, there are two primary registers PR0 and PR1, where each register includes two banks of 128 by 64-bit, two port, 8-bit byte writeable RAM, referred to as RAM_0 and RAM_1, respectively. Bank RAM_0 is the even bank and bank RAM_1 is the odd bank for each of the registers PR0 and PR1. An address from the RAG 202 is provided to an address decoder 602, which provides addresses to the select inputs of a series of input muxes 604 and 606, which provide their outputs to the pixel registers PR0 and PR1, respectively. Addresses are provided from a register of the MCU 108 to the input of the muxes 604 and 606 for providing addresses to the pixel registers PR0 and PR1, respectively. The address decoder 602 also provides select signals to another set of muxes 608 and 610 for selecting data from the pixel registers PR0 and PR1 for providing data either to the processor array 212 through an interconnection network 612, or back to the MCU 108 through the mux 610. In this manner, the PPE 212 could operate on one register while the MCU 108 could load or store the other register.

Figure 7:
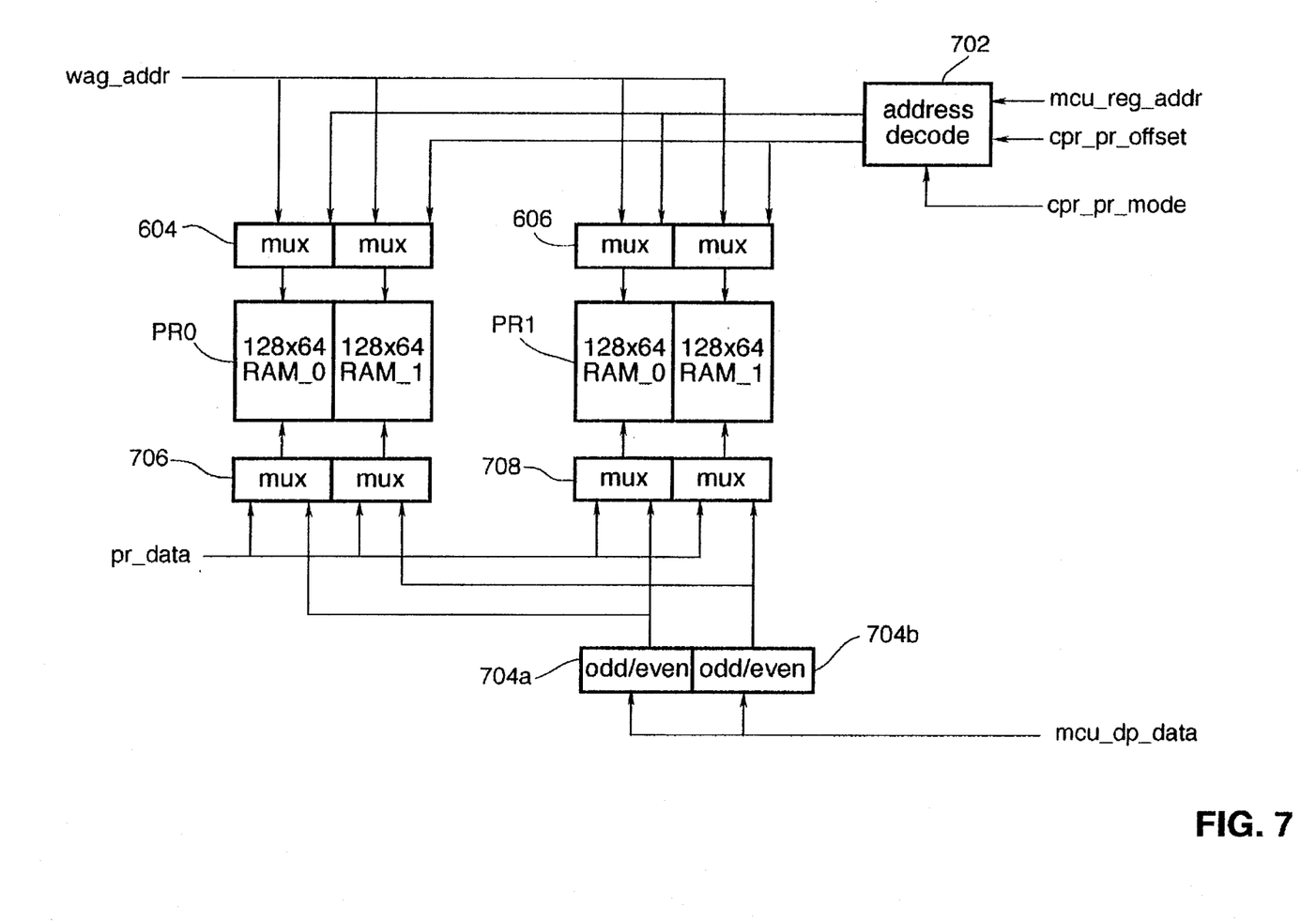
FIG. 7 is a more detailed block diagram of the write path circuitry of the pixel register of FIG. 2.

FIG. 7 illustrates the write circuitry of the pixel register 210. An address from the WAG 204 is provided to the select inputs of the input muxes 604, 606 and an address and offset from the MCU 108 is provided to an address decoder 702. This provides addressing to the pixel registers PR0 and PR1. Data from the MCU 108 is provided by two odd/even pixel assemblers 704a and 704b for providing data to the pixel registers PR0 and PR1, respectively, where the outputs of the pixel assembler 704a and 704b are provided to input muxes 706 and 708 corresponding to the pixel registers PR0 and PR1. The input muxes 706 and 708 select data between the MCU 108 of the processor array 212.

FIGS. 6 and 7 illustrate a more general embodiment, where an array of muxes and a shift network is provided for both pixel registers PR0 and PR1 to address the correct pixels and place them into the correct ordering. An embodiment including two separate pixel registers PR0 and PR1 emphasizes sharing of the pixel registers between the PPE 212 and the MCU 108, so that they could operate concurrently.

It is now appreciated that a method and apparatus for providing data to a processor array using a pixel register according to the present invention provides the advantages of a crossbar network without the prohibitive cost, size and power consumption. Also, overhead associated with address generators for multiple memory modules is substantially reduced. First and second (or odd and even) n-wide memory modules hold digital data for an array of n processing elements. An address decoder receives an address and asserts corresponding address values and a select value to access n pixels from the memory modules for selection by an array of muxes. The array of muxes select between respective columns of the memory modules and thus retrieve the pixels according to a predetermined order. The pixels are provided to a shift network receiving a shift value from the address decoder to reorder the retrieved pixels into the correct order for the processing array. The use of two memory modules, a mux array and shift network reduces the size, cost and power consumption as compared to a comparable multi-module embodiment using as crossbar network.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A data register for providing data to an n-element parallel processing array, comprising:

a memory buffer including first and second memory modules, each including n columns of data values;

an address decoder coupled to said memory buffer and receiving an address for asserting corresponding address values to access n data values at a time from said first and second memory modules;

select logic coupled to said first and second memory modules and to said address decoder for selecting between respective columns of said first and second memory modules and for retrieving n selected data values according to a predetermined order; and a shift network coupled to said address decoder and said select logic for reordering said retrieved data values from said select logic and for providing said reordered data values to the processing array.

2. The data register of claim 1, wherein each data value is an eight bit pixel.

3. The data register of claim 1, wherein n is equal to eight.

4. The data register of claim 3, wherein said first and second memory modules are both 64 bits wide.

5. The data register of claim 1, wherein said select logic comprises an array of multiplexers.

6. The data register of claim 5, wherein each multiplexer of said array of multiplexers comprises a 2:1 multiplexer.

7. The data register of claim 1, wherein said shift network comprises a plurality of stages of 2:1 multiplexers, wherein each stage includes at least n multiplexers.

8. The data register of claim 7, wherein said plurality of stages of 2:1 multiplexers includes a first stage for shifting by one data value, a second stage for shifting by two data values, and a third stage for shifting by four data values.

9. The data register of claim 1, wherein said shift network comprises an array of n×n:1 multiplexers.

10. The pixel register of claim 9, wherein n is equal to eight.

11. A pixel register for a programmable video filter, the video filter including read and write address generators, a microcontroller and an array of processing elements, said pixel register comprising:

a memory buffer for storing pixel values for processing by the array of processing elements, said memory buffer comprising first and second memory banks each having a width corresponding to the array of processing elements;

an address decoder for receiving an address from an address generator for accessing pixel values from said memory buffer;

select logic coupled to said memory buffer and to said address decoder for selecting between respective columns of said first and second memory banks for retrieving accessed pixel values according to a predetermined order; and a shift network coupled to said select logic and to said address decoder for reordering said accessed pixel values based on said address and for providing said reordered pixel values to the array of processing elements.

12. The pixel register of claim 11, wherein said select logic comprises an array of multiplexers.

13. The pixel register of claim 12, wherein said array of multiplexers includes a plurality of 2:1 multiplexers.

14. The pixel register of claim 11, wherein said shift network comprises a multi-stage multiplexer network.

15. The pixel register of claim 14, wherein the array of processing elements includes n processing elements, and wherein each stage of said shift network comprises an array of n multiplexers.

16. The pixel register of claim 11, wherein the array of processing elements includes n processing elements, and wherein said shift network comprises an array of n×n:1 multiplexers.

17. A method for providing data to an n-element processing array, comprising the steps of:

storing data values into two memory banks, each bank including n columns and a plurality of rows of data values;

decoding an address for determining the rows in each memory bank holding the data values indicated by the address;

selecting between respective columns of the memory banks to select the addressed data values into a predetermined order; and reordering the selected data values to the correct order indicated by the address and providing the reordered data values to the n-element processing array.

18. The method of claim 17, wherein said step of storing data values comprises the step of distributing consecutive data values into consecutive locations of the rows of the first and second data banks.

19. The method of claim 17, wherein said step of decoding an address comprises the steps of:

determining an address value to each of the first and second memory banks to access rows containing the data values indicated by the address;

determining a select value identifying the columns containing the data values indicated by the address; and determining a shift value indicative of a number of shifts to reorder the data values.

20. The method of claim 17, wherein said step of reordering the selected data values comprises the step of shifting the data values until the correct order is achieved.

* * * * *